(12) United States Patent
Zhang et al.

(10) Patent No.: US 8,898,598 B1
(45) Date of Patent: Nov. 25, 2014

(54) LAYOUT PATTERN MODIFICATION METHOD

(71) Applicant: Shanghai Huali Microelectronics Corporation, Shanghai (CN)

(72) Inventors: Chenming Zhang, Shanghai (CN); HsuSheng Chang, Shanghai (CN); Fang Wei, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 14/105,689

(22) Filed: Dec. 13, 2013

(30) Foreign Application Priority Data

Jun. 26, 2013 (CN) .......................... 2013 1 0258304

(51) Int. Cl.
  *G06F 17/50* (2006.01)
(52) U.S. Cl.
  CPC ................................. *G06F 17/5072* (2013.01)
  USPC .................. 716/53; 716/50; 716/51; 716/55; 716/118
(58) Field of Classification Search
  USPC .................................. 716/50, 51, 53, 55, 118
  See application file for complete search history.

(56) References Cited

U.S. PATENT DOCUMENTS

| | | | | |
|---|---|---|---|---|
| 6,350,977 B2 * | 2/2002 | Taoka | ........................... | 250/204 |
| 6,444,373 B1 * | 9/2002 | Subramanian et al. | ........... | 430/5 |
| 6,803,292 B2 * | 10/2004 | Kim et al. | ...................... | 438/401 |
| 7,191,428 B2 * | 3/2007 | Tang et al. | ....................... | 716/52 |
| 7,302,672 B2 * | 11/2007 | Pack et al. | ......................... | 430/5 |
| 7,615,746 B2 * | 11/2009 | Nagatomo et al. | ............ | 250/307 |
| 7,650,587 B2 * | 1/2010 | Baum et al. | ...................... | 716/54 |
| 8,103,984 B1 * | 1/2012 | Pierrat | ............................ | 716/53 |
| 8,560,978 B2 * | 10/2013 | Feng et al. | ....................... | 716/52 |
| 8,735,297 B2 * | 5/2014 | Kurjanowicz | .................. | 438/708 |

OTHER PUBLICATIONS

Jang et al., "Manufacturability Evaluation of Model-based OPC Masks", Dec. 2002, $22^{nd}$ Annual BACUS Symposium on Photomask Technology, Proceeding of SPIE, vol. 4889, pp. 520-529.*

* cited by examiner

*Primary Examiner* — Sun Lin
(74) *Attorney, Agent, or Firm* — Muncy, Geissler, Olds & Lowe, P.C.

(57) ABSTRACT

A method of layout pattern modification includes the following steps: step 1: performing an OPC process on a layout containing a plurality of square patterns to obtain a plurality of post-OPC patterns in correspondence with the plurality of square patterns; step 2: performing a manufacturing rule check on each of the plurality of post-OPC patterns to identify, from the plurality of post-OPC patterns, one or more post-OPC patterns violating the manufacturing rule; and step 3: rotating at least one of the one or more post-OPC patterns violating the manufacturing rule; and step 4: performing a manufacturing rule check on each of the rotated and non-rotated post-OPC patterns, if no post-OPC pattern violating the manufacturing rule is identified, finishing the process; otherwise, if one or more post-OPC patterns violating the manufacturing rule are identified, continuing to perform step 3 and step 4.

7 Claims, 3 Drawing Sheets

LAYOUT PATTERN MODIFICATION METHOD

CROSS-REFERENCES TO RELATED APPLICATIONS

This application claims the priority of Chinese patent application number 201310258304.3, filed on Jun. 26, 2013, the entire contents of which are incorporated herein by reference.

TECHNICAL FIELD

The present invention relates generally to semiconductor device fabrication, and more particularly, to a method of layout pattern modification.

BACKGROUND

With the integrated circuit (IC) design and manufacturing advancing to the very deep submicron (VDSM) era, critical dimensions of the circuit components have been approximate to or even smaller than the exposure wavelengths used in the photolithography process. This will worsen the image distortion caused by the diffraction and interference of the exposure light and lead to the lack of resemblance between mask patterns and desired patterns. Such deviations between the mask patterns and the desired patterns can directly affect the performance of the resulting circuits and decrease the product yield. Currently, optical proximity correction (OPC) provides an effective approach to eliminate such deviations.

However, in existing photolithography process for transferring hole patterns onto a substrate, after a conventional OPC is performed on a layout containing hole patterns spaced by desired intervals that initially satisfy manufacturing rules, the intervals between post OPC hole patterns may be narrowed and hence exceed the minimum achievable pattern-to-pattern space of the given process, thus leading to discrepancies between pattern sizes of the layout and mask manufactured using this layout and ultimately affecting the size accuracy of patterns transferred onto the substrate.

Specifically, for instance, as shown in FIG. 1A, to achieve a circular hole 1 in a target substrate, an original pattern 2 is designed to have the shape of a square circumscribing the circle of the circular hole pattern 1 and spaced from an adjacent original pattern 2 by a distance a0. However, after it is corrected using a conventional OPC process, the post-OPC pattern 3, which can lead to the circular hole 1 in the target substrate, may assume the shape of a larger square that encompass the original pattern 2, and accordingly, the distance between the post-OPC patterns 3 is narrowed. That is, the distance a1 between the post-OPC patterns 3 is smaller than the distance a0 between the original patterns 2. This narrower distance a1 may be smaller than the minimum achievable space of a given mask fabrication process and hence cause discrepancies between the post-OPC layout patterns and the fabricated mask patterns, which will finally lead to size errors in the patterns transferred onto the substrate.

One way of addressing the above issue is to fabricate the mask by using highly advanced apparatuses to achieve better manufacturing performance. However, this approach will also lead to increase in the cost of mask fabrication. Furthermore, adjusting the OPC accuracy to assure that the distance between any two post-OPC patterns is not smaller than the minimum achievable space of a given mask fabrication process provides another solution. However, obviously, this solution will lead to decrease in the OPC accuracy and may cause the resulting patterns on the substrate fail to have sizes as desired.

SUMMARY OF THE INVENTION

Accordingly, it is an objective of the present invention to address the above issue of the prior art by presenting a method capable of achieving OPC with sufficient accuracy without needing to use highly advanced mask fabrication apparatuses.

The above and other objectives are attained by a method of layout pattern modification, including the following steps: step 1: performing an OPC process on a layout containing a plurality of square patterns to obtain a plurality of post-OPC patterns in correspondence with the plurality of square patterns; step 2: performing a manufacturing rule check on each of the plurality of post-OPC patterns to identify, from the plurality of post-OPC patterns, one or more post-OPC patterns violating the manufacturing rule; and step 3: rotating at least one of the one or more post-OPC patterns violating the manufacturing rule; and step 4: performing a manufacturing rule check on each of the rotated and non-rotated post-OPC patterns, if no post-OPC pattern violating the manufacturing rule is identified, finishing the process; otherwise, if one or more post-OPC patterns violating the manufacturing rule are identified, continuing to perform step 3 and step 4.

This rotation is based on the theory that: in a photolithography process, when exposure light passes through a square hole on a mask, image distortion occurs at the four right-angle corners of the square hole and results in a circular pattern on the target substrate. For this reason, after a square hole pattern on a mask is rotated by a predetermined angle about a center thereof, the same circular pattern will be obtained on the target substrate.

Preferable, each of the at least one of the one or more post-OPC patterns violating the manufacturing rule may be rotated by a predetermined angle about a center thereof.

Preferable, the predetermined angle may be in a range of 30 degrees to 60 degrees, with a range of 40 degrees to 50 degrees being more preferred, and with 45 degrees being most preferred.

Preferable, each of the one or more post-OPC patterns violating the manufacturing rule may be rotated in the rotation step.

Preferable, performing a manufacturing rule check may include: comparing a space between a post-OPC pattern and a pattern closest thereto to a predetermined value; and determining the post-OPC pattern as satisfying the manufacturing rule if the space is greater than or equal to the predetermined value, or determining the post-OPC pattern as violating the manufacturing rule if the space is smaller than the predetermined value.

As described above, the two prior art solutions primarily rely on highly advanced mask fabrication apparatuses and sacrificing OPC accuracy to cope with the post-OPC patterns that violate the manufacturing rule. The foregoing preferred embodiments of the present invention are capable of addressing this prior art issue of manufacturing rule violation of certain post-OPC hole patterns or other square patterns by a simple rotation step, which could effectively increase the distance between rule-violating patterns without increasing cost or decreasing OPC accuracy.

BRIEF DESCRIPTION OF THE DRAWINGS

A more complete appreciation of the invention and the attendant advantages and features thereof will be readily obtained by reference to the following detailed description when considered in connection with the accompanying drawings, wherein.

Note that the figures of the accompanying drawings are illustrative only and are not intended to limit the scope of the present invention, and they may not be drawn precisely to scale. Same or analogous reference numbers in the various drawings indicate the similar elements.

DETAILED DESCRIPTION

The present invention will become more apparent and fully understood from the following detailed description of exemplary embodiments thereof, which is to be read in connection with the accompanying drawings.

Figure 1A:
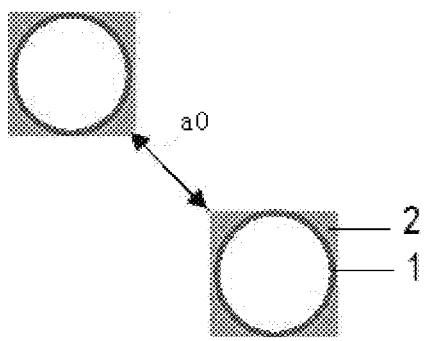
FIGS. 1A and 1B schematically illustrate how the distance between the closely-arranged post-OPC patterns violate the manufacturing rule of an existing mask fabrication process of the prior art.
Figure 1B:
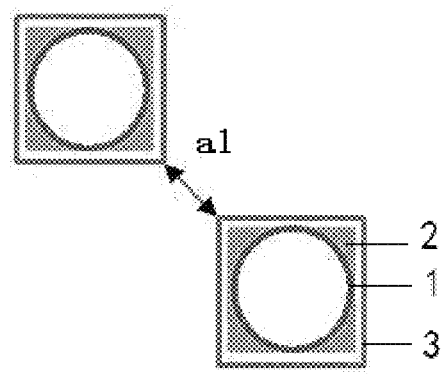
Figure 2:
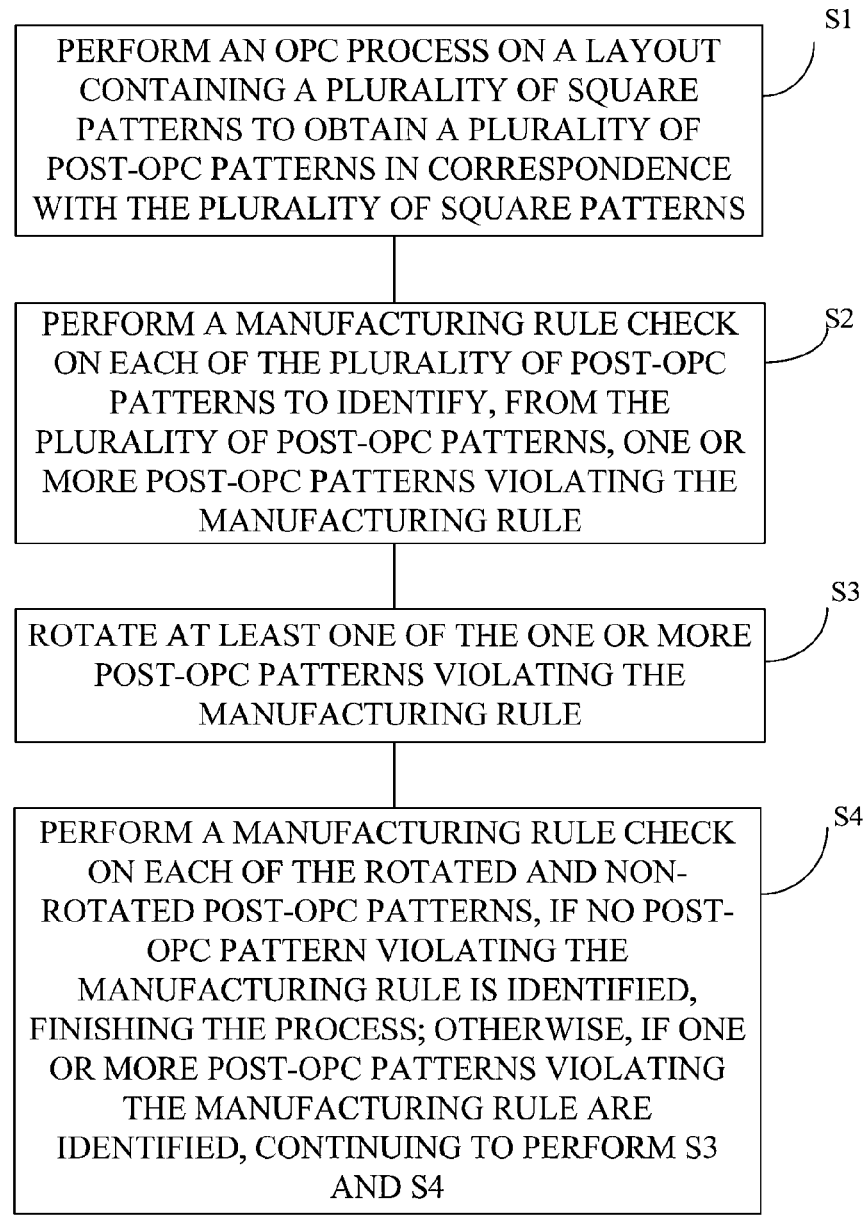
FIG. 2 is a flowchart graphically illustrating a method of layout pattern modification in accordance with one embodiment of the present invention.

FIG. 2 is a flowchart graphically illustrating a method of layout pattern modification in accordance with one embodiment of the present invention.

Figure 3:
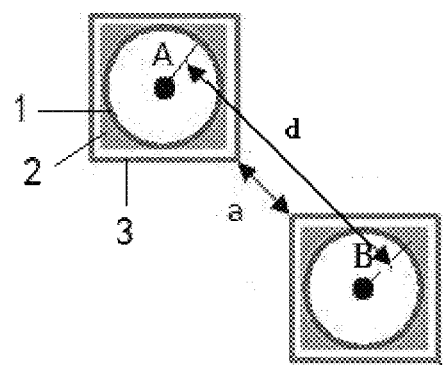
FIGS. 3 to 5 are schematics showing how layout patterns are modified in the method of the present invention.
Figure 4:
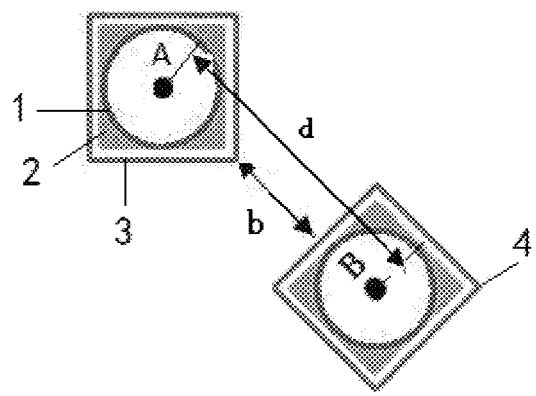
Figure 5:
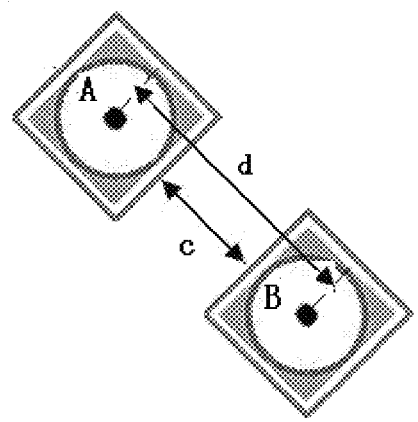

Referring now to FIG. 2, taken in conjunction with FIGS. 3 to 5, the method includes the following steps S1 to S4.

In step S1, an OPC process is performed on a layout containing a plurality of square patterns to obtain a plurality of post-OPC patterns in correspondence with the plurality of square patterns. Referring to FIG. 3, in the case that the layout contains original square patterns 2 each of which is designed for obtaining a circular hole pattern 1 in a target substrate, after the OPC is performed, the post-OPC patterns 3 of the original square patterns 2 each assume the shape of a larger square that encompasses the respective original square pattern 2, and the two post-OPC patterns 3 are spaced from each other by a distance indicated at a.

In step S2, a manufacturing rule check (MRC) is performed on each of the post-OPC patterns 3 to identify, from the plurality of post-OPC patterns, one or more post-OPC patterns 3 violating the manufacturing rule (i.e., the post-OPC patterns each of which is spaced from a closest post-OPC pattern by a distance that is smaller than the minimum achievable on-mask inter-pattern space). In this embodiment, it is assumed that the two post-OPC patterns 3 of FIG. 3 both violate the manufacturing rule.

In step S3, at least one of the one or more post-OPC patterns violating the manufacturing rule is rotated.

In step S4, a manufacturing rule check is performed on each of the rotated and non-rotated post-OPC patterns, if no post-OPC pattern violating the manufacturing rule is identified, finishing the process; otherwise, if one or more post-OPC patterns violating the manufacturing rule are identified, continuing to perform step S3 and step S4.

Referring to FIG. 4, only one (the one centered at the point B as shown in FIG. 4) of the two post-OPC patterns 3 of FIG. 3 may be rotated selectively about a center thereof (i.e., the point B, the intersection point of the two diagonal lines of the rotated square pattern), and the rotated pattern is designated by the reference number 4 in FIG. 4. As such, the distance b between the non-rotated post-OPC pattern 3 and the rotated post-OPC pattern 4 is obviously larger than the distance a. In this case, if the distance b has satisfied the manufacturing rule, it is not needed to further rotate the post-OPC pattern centered at the point A.

Alternatively, as seen in FIG. 5, both of the two post-OPC patterns 3 of FIG. 3 may be rotated to have a new spacing c which is obviously even larger than the distance b shown in FIG. 4.

Preferably, in step S3, each post-OPC pattern 3 violating the manufacturing rule is rotated by an angle of 45 degrees to achieve the best result. However, the present invention is not so limited, and for a square post-OPC pattern 3, the angle may be any other angle approximate to 45 degrees. By way of example, and not by way of limitation, the post-OPC square pattern 3 may be rotated by an angle in the range of 30 degrees to 60 degrees, with the range of 40 degrees to 50 degrees being more preferred, and with 45 degrees being most preferred.

In practice, after a layout of a mask is OPC-treated, in those post-OPC patterns known to lead to difficulties in mask fabrication according to the manufacturing rule of the existing mask fabrication process, it is applicable to rotate a single one of or some of or all of the post-OPC patterns by 45 degrees to expand their distances from the closest adjacent post-OPC patterns. Furthermore, because of the same optical characteristics, any rotated post-OPC square pattern will lead to the same circular pattern on the target substrate during exposure as that caused by a non-rotated post-OPC square pattern.

While the above embodiment is described herein in the context of two post-OPC patterns violating the manufacturing rule, it will be apparent to those skilled in the art that the method of the present invention may be employed to rotate one, part or even all of more post-OPC patterns violating the manufacturing rule to ultimately optimize the spaces between circular hole patterns transferred onto the target substrate.

In the case of FIG. 4, where either one of the two post-OPC square patterns violating the manufacturing rule is rotated by 45 degrees, let the distance between the two post-OPC patterns 3 shown in FIG. 3 be a and a side length of each of the patterns 3 be $2*R$, the distance d between the centers A and B of the two post-OPC patterns 3 can accordingly be expressed as $(2*2^{1/2})*R+a$. After one of the two post-OPC patterns 3 is rotated by 45 degrees, as shown in FIG. 4, the new distance b between them will be $b=d-(2^{1/2}+1)*R=(2^{1/2}-1)*R+a$, resulting in an amount of $(2^{1/2}-1)*R$, which can be approximated as $0.414*R$, larger than the distance a. That is, when either one of the two adjacent post-OPC patterns is rotated by 45 degrees, there will be an increase of $(2^{1/2}-1)*R$, approximately $0.414*R$, in the distance between them.

Moreover, In the case of FIG. 5, where each of the two post-OPC square patterns violating the manufacturing rule is rotated by 45 degrees, also let the distance between the two post-OPC patterns 3 shown in FIG. 3 be a and a side length of each of the patterns 3 be $2*R$, the distance d between their centers A and B can accordingly be calculated as $(2*2^{1/2})*R+a$. After the two post-OPC patterns 3 are each rotated by 45 degrees, as shown in FIG. 5, the new distance c between them will be $c=d-2*R=(2*2^{1/2}-2)*R+a$, resulting in an increase of $(2*2^{1/2}-2)*R$, which can be approximated as $0.828*R$, compared to the distance a. That is, when both of the two adjacent post-OPC patterns are rotated by 45 degrees, the distance between them will be increased by $(2*2^{1/2}-2)*R$, approximately $0.828*R$.

As indicated above, the rotation of post-OPC pattern(s) can enable the accurate correction of sizes of and distances between circular hole patterns transferred onto the target substrate while not increasing cost or causing violation of the manufacturing rule.

Although the embodiment is described herein in the context of layout modification for the purpose of forming circular holes on a target substrate, the present invention is not limited in this regard. Instead, it can be employed to modify any square or square-like layout patterns before mask fabrication. Accordingly, references to the term "square" herein are meant to include any shape approximately or substantially resembling a square.

Compared to the two prior art solutions which primarily rely on highly advanced mask fabrication apparatuses or sacrificing OPC accuracy to cope with the post-OPC patterns that violate the manufacturing rule. The foregoing preferred embodiments of the present invention are capable of addressing this prior art issue of manufacturing rule violation of certain post-OPC hole patterns or other square patterns by a simple rotation step, which could effectively increase the distance between rule-violating patterns without increasing cost or decreasing OPC accuracy.

It should be noted that, as used herein, unless otherwise specified or noted, the terms such as "first", "second" and "third" are terms to distinguish different components, elements, steps, etc. described in the disclosure, not terms to describe logical or ordinal relationships among the individual components, elements, steps, etc.

It is to be understood that the preferred embodiments of the present invention presented in the foregoing description are not intended to limit the invention in any way. Those skilled in the art can make various alterations, modifications, and equivalent alternatives in light of the above teachings without departing from the scope of the invention. Thus, it is intended that the present invention covers all such alterations, modifications, and equivalent alternatives that fall within the true scope of the invention.

What is claimed is:

1. A computer-implemented method of layout pattern modification, comprising the following steps:
   step 1: performing, by a processor, an optical proximity correction (OPC) process on a layout containing a plurality of square patterns to obtain a plurality of post-OPC patterns in correspondence with the plurality of square patterns;
   step 2: performing, by the processor, a check of a manufacturing rule on each of the plurality of post-OPC patterns to identify, from the plurality of post-OPC patterns, one or more post-OPC patterns violating the manufacturing rule;
   step 3: rotating at least one of the one or more post-OPC patterns violating the manufacturing rule; and
   step 4: performing, by the processor, a check of the manufacturing rule on each of the rotated and non-rotated post-OPC patterns, if no post-OPC pattern violating the manufacturing rule is identified, finishing the OPC process; otherwise, if one or more post-OPC patterns violating the manufacturing rule are identified, continuing to perform step 3 and step 4.

2. The method of claim 1, wherein each of the at least one of the one or more post-OPC patterns violating the manufacturing rule is rotated by a predetermined angle about a center thereof.

3. The method of claim 2, wherein the predetermined angle is in a range of 30 degrees to 60 degrees.

4. The method of claim 3, wherein the predetermined angle is in a range of 40 degrees to and 50 degrees.

5. The method of claim 4, wherein the predetermined angle is 45 degrees.

6. The method of claim 1, wherein each of the at least one or more post-OPC patterns violating the manufacturing rule is rotated in the rotation step.

7. The method of claim 1, wherein the performing a check of a manufacturing rule includes: comparing a space between a post-OPC pattern and a pattern closest thereto to a predetermined value; and determining the post-OPC pattern as satisfying the manufacturing rule if the space is greater than or equal to the predetermined value, or determining the post-OPC pattern as violating the manufacturing rule if the space is smaller than the predetermined value.

* * * * *